United States Patent [19]

Stoft

[11] Patent Number: 5,059,892
[45] Date of Patent: Oct. 22, 1991

[54] RADIO FREQUENCY SIGNAL INTERFACE

[75] Inventor: David E. Stoft, Bellingham, Wash.

[73] Assignee: Hewlett-Packard Company, Palo Alto, Calif.

[21] Appl. No.: 597,981

[22] Filed: Oct. 15, 1990

[51] Int. Cl.$^5$ .................... G01R 15/10; H04B 17/00
[52] U.S. Cl. .................................. 324/73.1; 455/226
[58] Field of Search ................. 324/73.1, 158 R, 115, 324/629, 630; 455/67, 115, 226; 364/481, 482

[56] References Cited

U.S. PATENT DOCUMENTS

| 4,245,352 | 1/1981 | Karpowycz et al. | ............... 455/226 |
| 4,719,459 | 1/1988 | Kovacs et al. | ................ 324/73.1 |

Primary Examiner—Ernest F. Karlsen

[57] ABSTRACT

A multi-function, general purpose apparatus includes various instrument modules configured to perform a number of functions controlled by an internal processor, stored programs and user selected inputs. A five-port RF signal interface couples the apparatus to user equipment under test to allow a wide range of RF signal measurements over a wide range of test signal levels. The RF signal interface buffers the user equipment from the apparatus internal modules while providing a uniform attenuation of an RF test signal over the RF path to the desired internal module. Antenna, RF Input and Duplex ports provide apparatus connection to user equipment while signal generator and receiver ports provide internal apparatus connections. An apparatus internal processor is user and software controlled to provide automatic sweep tuning of RF interface filter sections and automatic sensitivity settings for the interface amplifier and attenuator sections. A preferred embodiment of the invention includes a multi-function general purpose test system particularly adapted to the testing and measuring of signals to and from RF apparatus.

16 Claims, 6 Drawing Sheets

RADIO FREQUENCY SIGNAL INTERFACE

BACKGROUND OF THE INVENTION

The present invention relates generally to a processor-controlled multi-function general purpose radio frequency (RF) signal measurement and test instrument and, more particularly, to an integrated RF signal interface which couples RF signals between a plurality of test instruments, all of which are common to a single measurement and test instrument, and to external user equipment.

With the availability of sophisticated microprocessors, instrumentation designers have found it both possible and practical to integrate, within a single instrument, separate electronic devices which perform multiple, substantially independent functions. In the field of electronic measurement and test instrumentation, this has been more the rule than the exception in recent years. Electronic measurement and test instruments are now available which perform multiple, separate measurement and test functions with all the circuitry necessary to carry out those functions housed in a single chassis.

Previous attempts to integrate multiple test instruments into a single, general purpose measurement and test instrument have resulted in substantial complexity in the RF interface between the instrument and the external user equipment under test. It has been a technical challenge to instrumentation designers to provide an interface between equipment under test and test instrumentation which would allow a wide range of possible measurements without introducing additional and complex requirements for additional pieces of instrumentation, such as attenuators, for coupling test signals. Further, because of such complex interfaces, potential cost and functional benefit gain from integrated, general purpose test instrumentation is often lost or achieved only at additional cost for required signal coupling blocks and user extensive education of efficient use.

SUMMARY OF THE INVENTION

The input section of a multi-function, general purpose, measurement and test instrument constructed in accordance with the principles of the present invention comprises a five port RF signal interface within a single instrument which provides a wide range of possible measurements over a wide range of test signal levels. The RF signal interface buffers RF test signals between the user equipment under test and the instrument internal circuits. Antenna, RF Input/Output (I/O) and duplex ports provide connection to the use's equipment under test while signal generator (Sig-Gen) and Receiver ports provide internal instrument connections. An instrument internal controller is operator and software controlled to provide all algorithmic functions and an internal voltmeter, frequency counter and tuned RF receiver provide required signal measurements. Low level RF signals are coupled via the antenna port which includes a pre-amplifier section to improve the signal-to-noise ratio (SNR). High level RF signals, the output of an RF transmitter for example, are connected directly to the RF I/O port which is appropriately buffered to provide interference-free measurements via the instrument receiver section, spectrum analyzer or an input section RF peak detector.

An instrument-internal Sig-Gen output signal can be coupled either to the interface duplex port or RF I/O port. The duplex port provides higher level signals than the RF I/O port and allows two-port testing when used with the antenna or RF I/O port. For example, a filter may be tuned utilizing the antenna port or a two-port full duplex radio may be tested utilizing the RF I/O port. The antenna port includes an input step attenuator which provides buffering of medium level RF signals up to +20 dBm. An interface pre-scaler, coupled to both the antenna and RF I/O ports, provides a frequency divided signal to the instrument-internal frequency counter thus providing capability for auto-tuning. An interface filter pre-selector filters an input signal based on the instrument receiver or spectrum analyzer tune frequency providing spurious signal response rejection which allows the use of an in-band local oscillator having a frequency less than 1.0 GHz for the instrument-internal spectrum analyzer. Because of the wide variety of circuit functions and signal paths a user test signal will pass through to reach the instruments receiver or spectrum analyzer, a variable attenuator corrects for frequency dependent signal path loss creating a single path loss/gain value, independent of frequency, thus providing a uniform noise level for the instrument spectrum analyzer.

The RF signal interface, in combination with the measurement and test capabilities of the test instrument, provides RF peak power and RF carrier frequency measurements, internal instrument signal generator output step attenuation, automatic level control of input signals and automatic pre-selection filtering for signals coupled to the instrument receiver port. The RF signal interface of the present invention presents a unique combination of capabilities not previously provided in prior art, single, general purpose instruments. Further, with three user accessible ports provided, test connections and configurations are simplified and both the novice and expert user alike can utilize the instrument for desired tests and measurements with a minimum of setup and training.

DESCRIPTION OF THE DRAWING

A fuller understanding of the present invention will become more apparent from the following detailed description taken in conjunction with the accompanying drawing which forms a part of the specification and in which.

DETAILED DESCRIPTION OF THE PREFERRED EMBODIMENT

Figure 1:
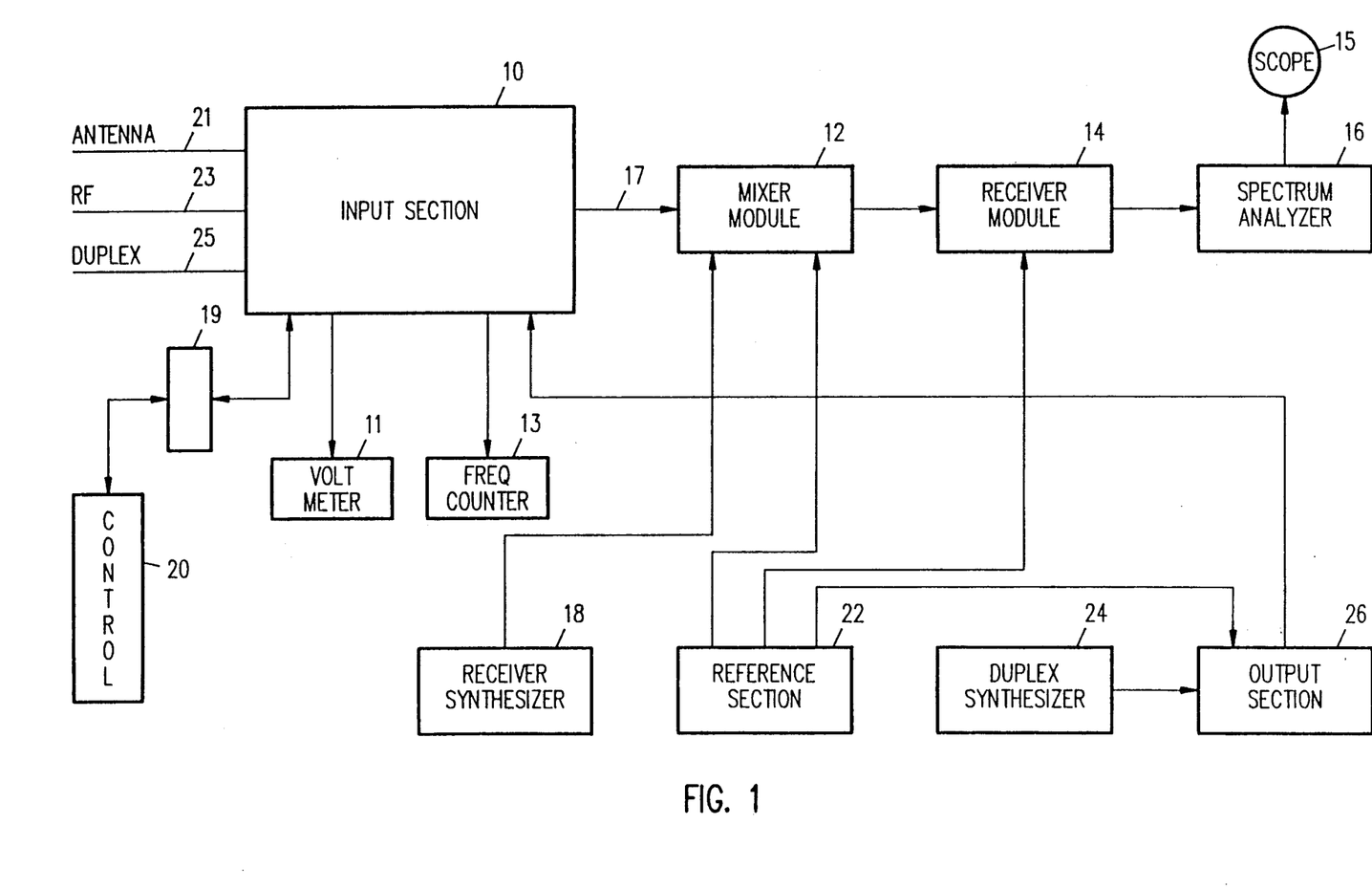
FIG. 1 is a block diagram of an integrated multi-function RF signal test instrument in accordance with the principles of the present invention.

Referring now to FIG. 1, an integrated general purpose radio frequency (RF) test and measurement instrument is shown with an input section 10 which provides an RF signal interface in accordance with the principles of the present invention. The instrument shown in FIG. 1 is a multi-function apparatus having the capability to carry out the functions of receiver test, transmitter test, duplex test, provide audio and RF test signals and includes audio and RF frequency signal anlyzers, a spectrum analyzer and a front panel mounted display scope.

As discussed above, the instrument provides a plurality of functions which are controllable through a user-friendly input panel interface. The instrument's operation is under the control of processor/controller 20 which provides real-time operational control of the test instrument. The instrument includes a plurality of internal modules, each of which is configurable in conjunction with other modules, to provide the called-for instrument function.

Input section 10 is the main interface to the unit or equipment under test and is controlled by the host instrument processor 20 via two serial I/O interfaces 19 discussed in more detail hereinbelow. Three test interconnection ports are shown, i.e., duplex 25, RF I/O 23, and antenna 21. Receiver 14 receives RF signal inputs via an interface receiver output port 17 and Mixer module 12 and provides demodulated signals to various analysis instrumentalities implemented by the test instrument. Spectrum analyzer 16, including a Radio Frequency analyzer (not shown), comprises an analysis device which performs the well-known functions associated with those instrumentalities. The duplex synthesizer 24 forms a signal generator which, along with the reference module 22 and output module 26 enable the generation of audio frequency, radio frequency, and modulation signals necessary for the various instrument functions. Voltmeter 11 and counter 13 modules provide measurement of signal values to controller 20 which, in turn, operates the display controller and display 15. Display 15 can be configured to show any of a plurality of screens, each screen equivalent to a part of, an entire or multiple sub-instrument(s) implemented by the host instrument.

Processor/controller 20, under control of the user input panel (not shown) and stored software, configures each of the modules shown in FIG. 1 into the called-for functional instrument. Thus, if the instrument is to be used as an RF source, processor controller 20 connects the signal generator to the appropriate output port in input section 10 where the signal is passed to the unit under test. Similarly, if the instrument is to be configured as spectrum analyzer, input section 10 has its RF signal paths configured for the applied signal power level while the display 15 controller, rather than the instrument processor 20, control the pre-selection filter 33 tuning. The spectrum analyzer 16, then, provides the sweep amplitude voltage to the display 15 to provide the well known oscilloscope-type trace. The voltmeter module 11 is coupled to all of the instrument modules via a multiplex switch (not shown) to provide desired voltage readouts.

Figure 2:
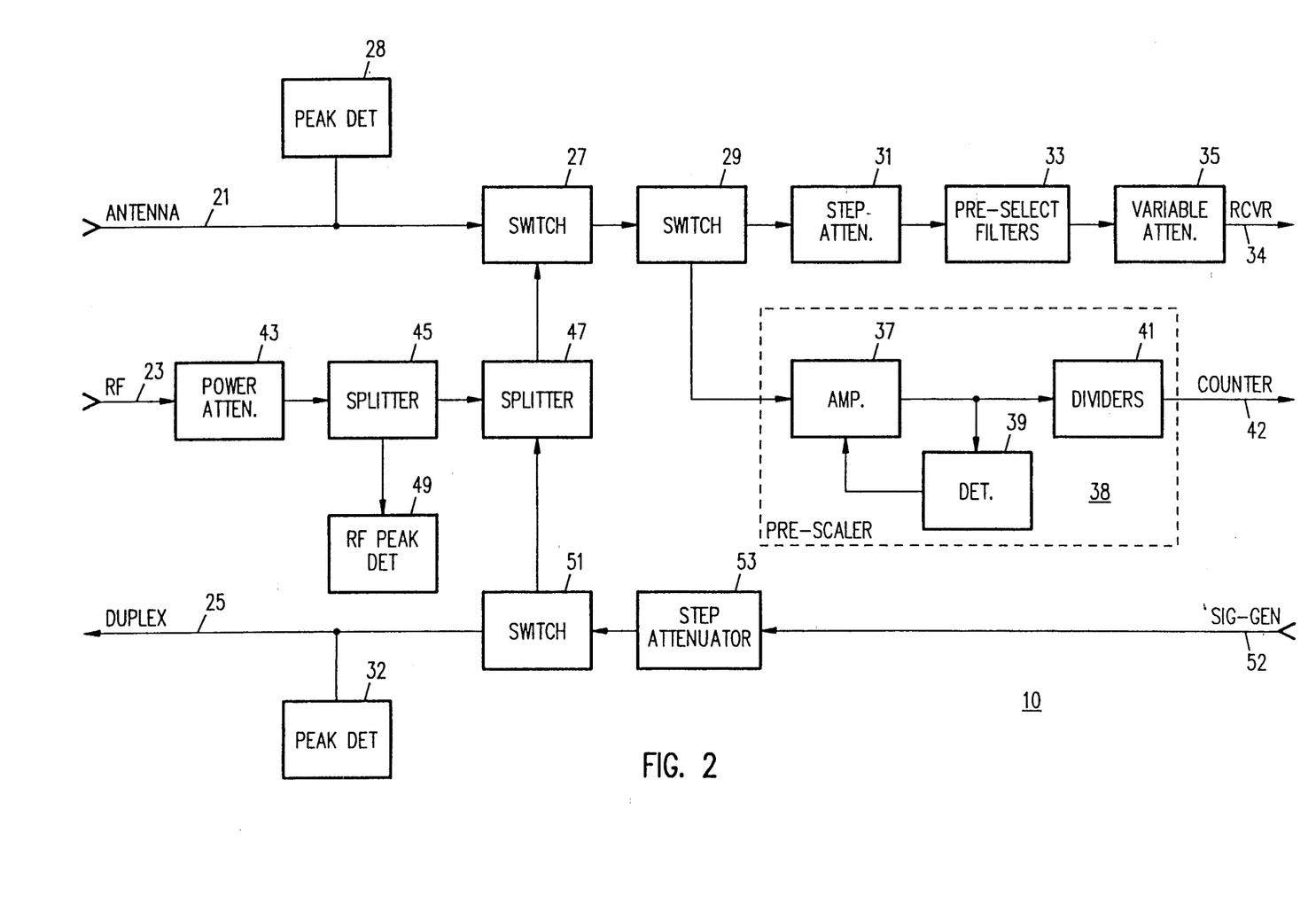
FIG. 2 is a block diagram of the input section of the test instruments shown in FIG. 1.

Referring now to FIG. 2, a block diagram is shown which illustrates the major subassemblies of the RF signal interface 10. The instrument input section supports three interconnection ports which allow user equipment under test to be coupled to the test instrument. Test signals may be input to the input section via the antenna port 21 and the RF I/O port 23. In addition, test signals generated internally by the test instrument may be output to equipment under test via the RF I/O port 23 and the duplex port 25.

An RF signal applied to the antenna port 21 can be attenuated by a relative amount of 0, 20, or 40 dB by step attenuator 31 to limit the signal level at the Receiver port output 34. The signal from the input attenuators is filtered and then directed through a variable attenuator 35 whose setting is a function of the signal frequency and RF path through the RF signal interface 10 to the receiver port 34.

The antenna port 21 provides "off-the-air" measurements using the receiver 14 and spectrum analyzer 16 modules as well as providing two-port testing when using the duplex port 25. In addition, the antenna port 21 may be coupled to an RF power splitter 47 to configure the test instrument for two-signal generator testing of user equipment. An RF test signal provided by a second external signal generator is input via the antenna port 21 and coupled to the user equipment via the RF I/O port 23.

The amplitude of a user test signal applied to the RF I/O port 23 is attenuated by a high-power attenuator 43 followed by a balanced, 6 dB power splitter 45. One port of power splitter 45 drives an RF peak detector 49 and the other drives a second balanced, 6 dB power splitter 47. Splitter 47 couples the attenuated signal to the Receiver port 34 via switch 27 and also couples test signals from the instrument internal Sig-Gen via a 140 dB step attenuator 53 and switch 51.

Isolating the RF peak detector 49 from the RF port 23 by 23 dB and the Receiver/Sig-Gen signal paths by at least 12 dB, minimizes possible signal distortions caused by the RF Peak detection circuit 49. In addition, the power splitters 45, 47 minimize power measurement inaccuracies due to impedance mismatch errors created by the user's equipment. Signal splitters 45, 47 permit single-port, full-duplex measurements since the instrument can provide and accept RF signals simultaneously.

RF signals from the antenna port 21 or RF I/O port 23 are coupled via an electronic signal splitter switch 29 which directs the RF signal to either the receiver port 34 or a pre-scaler circuit 38. The splitter switch 29 always couples at least a portion of the RF signal to the pre-scaler circuit 38 to provide continuous monitoring of the signal level and frequency. The pre-scaler 38 comprises a limiter, high gain amplifiers 37 with AGC, TTL-ECL/ECL buffer amplifiers, and a TTL/ECL frequency divider 41 to provide signals of less than 5 MHz to the test instrument's counter 13 on line 42. Measuring the frequency of the user test allows pre-setting of the pre-selection filters 33 and the instrument receiver frequency. An RF peak detector, at the output of the broad-band amplifier 37, provides input for the AGC loop as well as for auto-ranging and auto-zeroing functions explained in greater detail below.

To limit the Receiver port signal amplitude, step attenuator 31 provides up to 40 dB of relative attenuation (in two 20 dB steps) in the RF signal path utilized by the antenna 21 or RF I/O 23 ports. The pre-scaler detector 39, on the input side of the step attenuator 31, provides broad-band RF signal level information for setting the attenuation. Since the detector 39 precedes the attenuator 31, and is therefore always capable of measuring the RF signal level prior to attenuation, automatic amplitude range selection by means of the instrument controller 20 is possible.

The instrument duplex signal generator provides a 400 KHz to 1 GHz, −5 to +15 dBm signal via RF path 52 to the 140 dB step attenuator 53 via the instrument Sig-Gen port 52. The attenuated signal can be directed to either the duplex port 25 or the RF port power splitter 47 via switch 51. When sourcing signals out of the duplex port 25, a two-port measurement system may be configured by coupling the duplex port 25 signal through the user equipment under test and back to the test instrument RF I/O port 23 or antenna port 21.

The DC voltage offset of the RF peak detector 49 output is influenced by many factors, including temperature, thus producing errors in the absolute value of the measured RF signal power. The pre-scaler amplifier 37 and detector 39 circuitry is utilized to detect a user signal below the RF peak detector 49 lower measurement threshold level and provide a signal to the controller 20 to determine appropriate times for using the RF peak detector 49 output as a zero-power reference to remove a significant portion of the RF signal measurement offset error.

The power splitters, switches, filters and other circuit components in the RF signal paths contribute different loss values as a function of the signal path selected and the signal frequency used. An additional, electronic, variable attenuator 35 provides the controller 20 with the capability to maintain uniform RF signal path attenuation as a function of signal frequency for each RF signal path.

Both the antenna 21 and duplex 25 ports have RF peak detectors 28, 32, respectively, which monitor user applied signals. If the applied signal exceeds a pre-determined level (for example, +27 dBm) the path selection switch 27, 51 for the port affected would be latched, by means of direct-coupled circuitry, to an open, disconnected, or other damage-limiting state thus protecting the Rf signal interface circuitry.

Figure 3A:
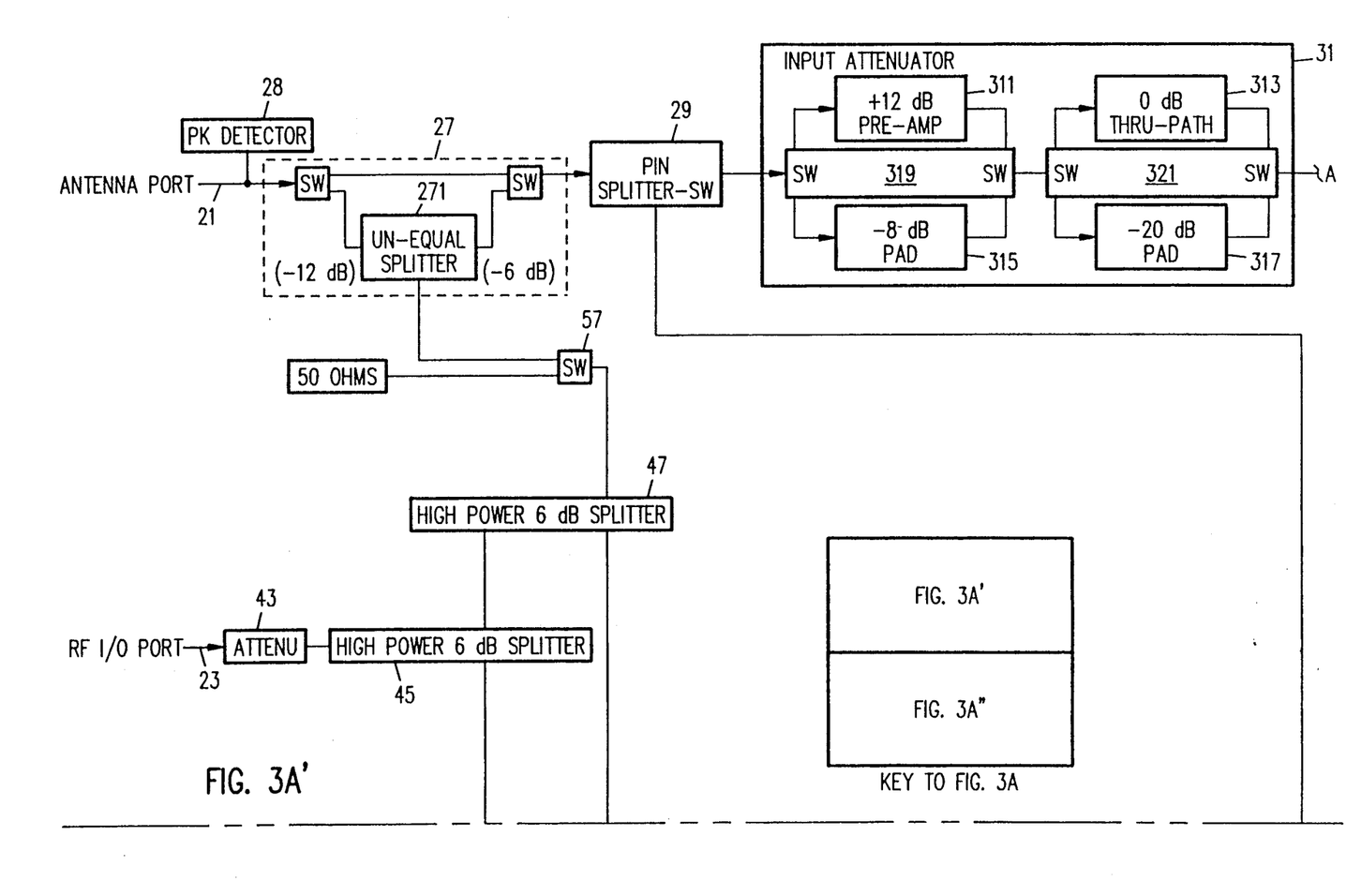
FIGS. 3A and 3B are a detailed functional block diagram of the input section of the test instrument shown in FIG. 1.
Figure 3B:
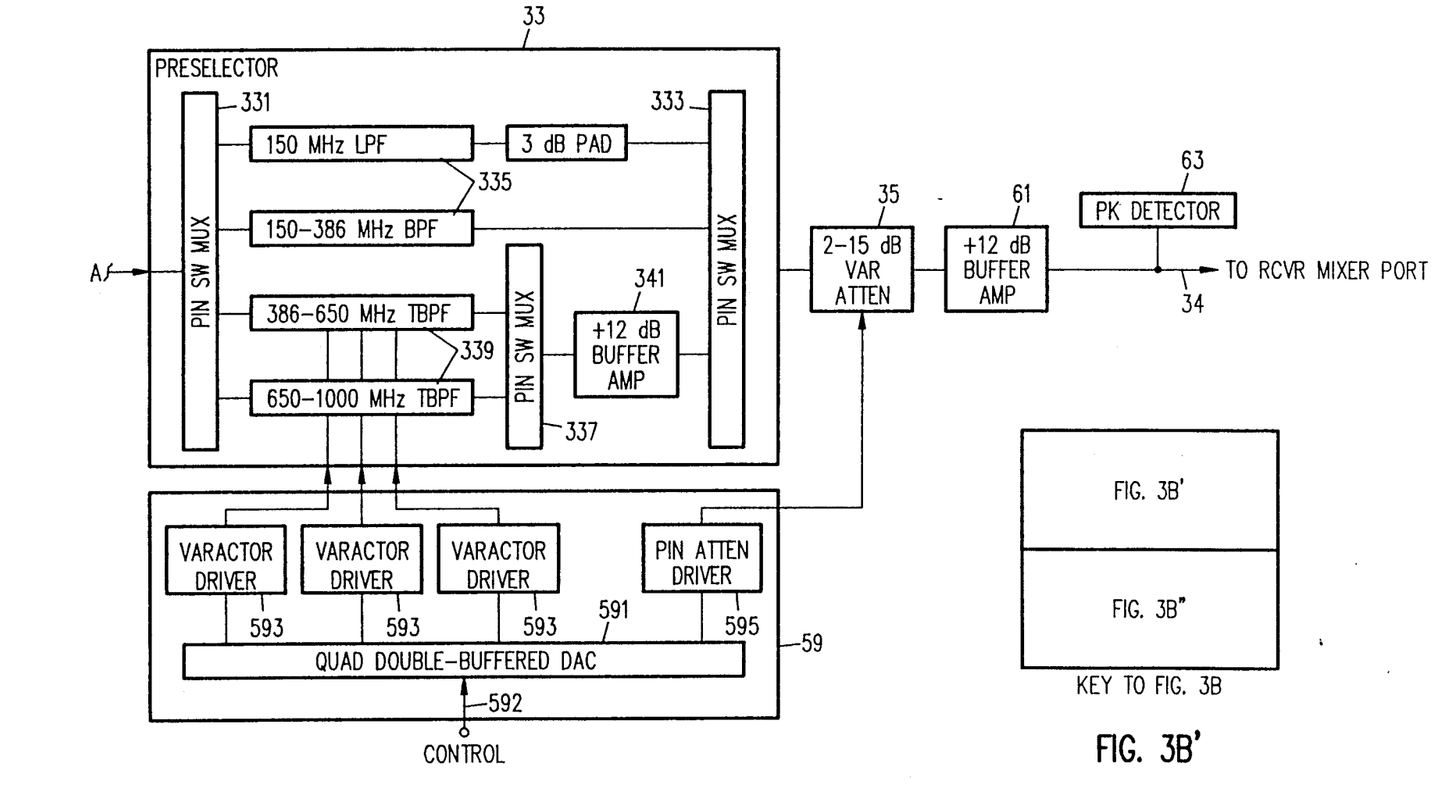

Referring now also to FIGS. 3A and 3B, a detailed block diagram of the RF signal interface 10 is shown. During most receiver 14 or spectrum analyzer 16 operations, input signals at the antenna port 21 are connected directly to the receiver path PIN diode switch 29 and to the receiver port 34 via switch 27 in its straight-through state. A second switch 27 state is multi-purpose as the antenna port 21 becomes connected to one port of an un-equal power splitter 271. This allows the antenna port 21 to form a second signal path for two-sig-gen testing of user receivers coupled to the RF I/O port 23. Such external signals are attenuated by an additional 12 dB providing the total signal path loss of 38 dB which allows a +10 dBm secondary generator source (not shown) to supply −28 dBm to a user's receiver via the RF I/O port 23.

In its second state, the antenna port switch 27 also routes test signals input at the RF I/O port 23 to the receiver port 34 with 32 dB of signal splitter path loss. A 60 watt (+48 dBm) input signal is thus attenuated to 48−32−3−8−20=−15 dBm at the mixer 12 (which is within its −14 dBm max input level specification).

Input signals directed from the RF I/O port 23 to the receiver port 34 are coupled through an isolation switch 57. When the antenna port 21 and duplex port 25 are used in combination to provide two-port testing, the isolation switch 57 increases the real RF signal isolation to approximately 80 dB. The switch relays typically provide greater than 32 dB of ideal off-state isolation at 1 GHz to provide a theoretical sum of 3*32+12+6=114 dB. The Rf power splitter 47 port of the isolation switch 57 is terminated in a 50 ohm load for the isolation state to keep the power splitter 47 properly balanced.

All RF signal routed to the receiver 14 or spectrum analyzer 16 are coupled via the receiver path PIN splitter/switch 29. The PIN splitter/switch comprises a single-pole-double-thrown PIN diode switch and an un-equal splitter based on a pi pad. In the receiver path mode, signals are attenuated by less than 3 dB white being routed to the input attenuator 31. Most of this loss is due to the resistors forming one side of the pi pad. The other side of the pi pad comprises a resistor in series with the approximately 50 ohm impedance formed by the pre-scaler circuit 38.

The other mode of the PIN splitter/switch 29 is purely a switch mode with the receiver path switched off and the pre-scaler 38 port switched on. The advantage of this configuration is that the input RF signal is sampled by the pre-scaler at all times thus providing monitoring of the input RF signal for auto-ranging and auto-tuning processes without disturbing the RF measurement signal path. When the PIN splitter/switch 29 is in the receiver path mode, the signal coupled to the pre-scaler 38 is attenuated approximately 16 db via the pi pad. The series PIN diode is selected for its low junction capacitance to provide increased signal isolation at higher frequencies, a significant factor at frequencies approaching 1 GHz.

RF test signals input at both the antenna port 21 and the RF I/O port 23 are coupled to the receiver port 34 via an input attenuator 31 and an input pre-selector filter circuit 33. To ensure that the RF signal coupled to the mixer module 12 is within the proper specifications, sufficient signal attenuation must be provided. At the same time, to insure sufficient receiver module sensitivity for the low level input signals at the antenna port 21, sufficient signal amplification must also be provided. The input attenuator 31 provides two switched level steps of 20 dB each, the first step is formed by +12 dB of gain or 8 db attenuation, the second step being 0 dB or 20 db of attenuation.

The pre-amplifier 311 is an MSA-0785 modular amplifier with greater than 14 dB of gain at 50 MHz but only about 13 dB of gain at 1 GHz. Utilizing three series resistors in a collector-base feedback loop provides a relatively flat 12 dB gain amplifier over the entire frequency range. Switches 319 and 321 switch between the 12 dB amplifier 311 and an −8 dB pad and between a 0 dB path and a −20 dB pad, respectively, to provide a 40 dB range in two steps. To provide gain stability, a separately regulated power supply of +10 volts is provided and the amplifier collector current is optimized for minimum third harmonic distortion which occurs at about 40 mA.

Harmonic distortion is a significant problem when amplifiers are placed ahead of mixer and filter stages. By optimizing the bias on the pre-amp 311 and maintaining user input signal levels below −34 dBm, second harmonic distortion is reduced below −69 dBc. Other receiver path components, such as the PIN switching multiplexers (MUX) 331, 333 produce less than −74 dBc harmonic distortion for a −20 dBm input signal level and do not add significant harmonic distortion. At input signal levels below −10 dBm, the MSA-0785 amplifier exhibits about a −3 dB harmonic level change per 1 dB input signal level change.

By adding external collector-base and series-emitter feedback to the MSA-0785 device, parasitic oscillations are easily controlled and very flat (+/−0.25 dB) frequency response at 10-12 dB of gain are achievable. Additional reactance in the form of collector-base feedback trace inductance, emitter shunt capacitance, and input shunt inductance provides some additional low-Q peaking beyond 1 GHz which compensates for some of the receiver path signal losses.

The high power RF I/O port 23 is coupled to the receiver port 34, peak detector 49, and Sig-Gen port 52 via a two stage resistive power splitter 45, 47. The first 6 dB power splitter 45 provides impedance matching and buffering for the RF port peak detector 49. The second 6 dB power splitter 47 combines RF signals from the duplex generator and the antenna port.

When a 60-watt signal is applied to the RF I/O port 23, the power splitter 45, 47 must dissipate at least 2.4 watts. The power splitter 45, 47 of a multi-resistor design comprising a series-parallel combination of chip resistors. The design allows use of low cost components with a worst-case power dissipation of 75 mW per resistor. Further, the series-parallel layout enhances the distribution of parasitic losses thus improving the impedance match for all ports. The printed circuit trace connections are optimized to provide the best average impedance match over the instrument frequency range.

The instrument front panel connector for the RF I/O port connects to the input section connector via a fixed, high power, 14 dB attenuator 43. The attenuator pad impedance match of greater than 25 dB return loss effectively isolates the RF power splitter 45 from the user's signal source.

Since the RF detector 49 is used over both the inverse square-law and linear regions resulting in wide range of diode impedances, the RF detector 49 is buffered by the balanced power splitter 45 and a voltage/splitter 495 which limits the maximum voltage to the RF diodes 491, 493 and provides a low source drive impedance. This also provides some compensation for the diode junction capacitance which can become a significant fraction of the diode impedance at frequencies above 500 Mhz and thus induce greater sensitivity-curve anomalies.

Each detector 491, 493 is a parallel dual diode circuit, the second diode providing temperature compensation. The diodes are held "on" by the application of 20 uA of DC current so that Vd across the diode is about 200 mV. Application of approximately 500 uW of RF signal energy, at the diode, will provide sufficient rectified current to charge an anode capacitor an equal, but reverse, 200 mV. This would result in 0 Vdc except for the temperature compensation diode offset. The combined pair of detectors 491, 493 provide a 3 dB improved signal-to-noise ratio (SNR) to partially compensate for the RF signal resistive divider 495. A low-value resistor placed in series with each detector diode is lossy and partially inductive and reduces diode resonance. The resistor value is layout and diode dependent. The anode charging capacitor is 560 pF and represents a compromise between detector response time and low RF frequency performance.

Any change in detector current, induced by something other than the applied RF signal energy, is an error. Instability of the diode bias, thermal tracking errors across the dual diode package, or differential amplifier 497 input current variations will induce measurement errors. The absolute DC offset of the peak detector circuit can be measured, but only in between applications of RF signal power.

A temperature sensor 492, such as an LM35, is thermally coupled to the temperature compensation diodes of the detector pair 491, 493 by means of two 15 pF surface mount capacitors (not shown). The temperature sensor is, at the same time, thermally isolated from other metallic structures. The temperatures sensor 492 provides a measure of the detector pair 491, 493 absolute temperature to the processor 20 to be utilized by the instrument calibration algorithms. Since minimizing the thermal gradient will minimize thermally induced errors, mounting the detection circuitry, or at least the detector diode pairs, on aluminum substrate material will reduce the thermal gradient and provides enhanced thermal performance.

The DC differential amplifier 497 is a unity gain, differential design with an additional 100 mV DC offset applied. The offset is required to keep the absolute DC voltage always about the 0.0 +/−50 mV uncertainty region of the instrument voltmeter 11. The final amplifier stage of the DC amplifier 497 is near-unity gain, buffer driven from a voltage divider. The peak detector circuit will produce about 9 volts DC for a 150 watt test signal input at the RF I/O port 23. Since the instrument voltmeter 11 input is limited to 5 volts, the voltage divider provides an approximate 2:1 divide ratio.

A post-RF-detector or modulation peak detector 499 provides peak signal power measurement of amplitude modulated signals. The output from the RF peak detector on line 498 drives a high-speed comparator driver 501 which charges a storage capacitor 503 via a charging diode (not shown). The capacitor's voltage produces an output DC level and feedback for the comparator driver 501. While the comparator driver 501 is capable of fast charging the capacitor 503, the instrument controller 20 must provide a reset signal prior to every measurement to ensure accuracy and to compensate for any decrease of the RF signal level since the previous measurement. A near-unity gain buffer 505, following a divider, provides scaled voltages for the instrument voltmeter 11.

The RF performance of the spectrum analyzer 16 depends on the use of pre-selection filters. The receiver 14 performance is also enhanced by the use of signal filters. Without the pre-selection filter circuit 33, the spectrum analyzer's use of intermediate frequencies below 1 GHz produces undesirable mixing products obscuring signals of interest. Table I provides the appropriate filter selections as a function of instrument frequency band.

TABLE I

| | Filter Selection vs Tune Frequency | | |
| --- | --- | --- | --- |
| BAND | FILTER | L.O. | IMAGE |
| 400 kHz | 150 MHz LP | 614.4–764 MHz | 1228.4–1378.0 |
| 150 MHz | | Fin + 614 | Fin + 1228 MHz |
| 150 MHz | 150–386 MHz | 764–1000 MHz | 1378–1614 MHz |
| 386 MHz | BP | Fin + 614 MHz | Fin + 1228 MHz |
| 386 MHz | 350–650 MHz | 500–764 MHz | 614–878 MHz |
| 650 MHz | TBPF | Fin + 114 MHz | Fin + 228 MHz |
| 650 MHz | 650–1000 MHz | 764–914 MHz | 878–1028 MHz |
| 800 MHz | TBPF | Fin + 114 MHz | Fin + 228 MHz |
| 800 MHz | 650–1000 MHz | 536–886 MHz | 572–772 MHz |
| 1000 MHz | TBPF | Fin − 114 MHz | Fin − 228 MHz |

The pre-selection filter circuit 33 comprises a set of selectable fixed-tuned filters 335 and tuned bandpass filters 339 as shown in Table I. The RF sginal is routed to and from the appropriate filter via input and output multiplexer switches (MUX) 331, 333. Filter selection is accomplished by the instrument controller 20 via a digital-to-analog converter (DAC) and varactor drive circuit 59. The two mux switches 331, 333 were designed for low cost and comprise relatively few inductors, few diodes and simple driver circuits. Providing a resistor-isolated and capacitor bypassed point for drive control minimizes the number of RF chokes required. Each MUX has only a single inductive isolation node. Further, the physical component layout is optimized to minimize added inductance and thus reduce the high frequency problems associated with component connections on PC boards. The MUX driver (not shown) provides about 8.5 mA through the on diode which reduces the diode's signal path insertion loss to approximately 0.05 dB more than when saturated at 15 mA (about 1.0 dB at 500 MHz). Additional signal path loss through the tuned bandpass filters 339 at signal frequencies above 386 MHz requires an additoinal PIN diode switching MUX 337 and a +12dB gain buffer amplifier 339 at the output of the high frequency bandpass filters 339.

Both the fixed-tuned filters 335 comprise fixed, lumped-element filters. The 150 MHz lowpass filter is a 7th order Chebychev filter and the 150-386 MHz bandpass filter is an 8th order elliptical filter having an additional filter notch at 614 MHz to minimize direct spurious feed-through to the instrument receiver 14 first IF stage at 614 MHz. A 3dB fixed pad follows the 150 MHz lowpass filter to match the RF signal path loss of the 150-386 MHz filter thus reducing the dynamic range requirements of the variable attenuator 35.

Both the tuned bandpass filters 339 comprise three-section, field-coupled filters having a Q of approximately 30. Filter insertion loss is on the order of 10 dB requiring a buffer amplifier 341 to precede the output MUX 333. The tuned bandpass filters 339 utilized in the preferred embodiment are described in greater detail in copending patent application entitled "Amplitude Correction of Field Coupled Varactor Tuned Filters" assigned to the instant assignee. The field-coupled design provides nearly a two-to-one dynamic frequency range and the high filter Q required by the instrument spectrum analyzer module 16.

Input Section control is split between two serial I/O interface chips 19. One is exclusively for filter MUX 331, 333, filter tuning 59, and variable attenuator 35 control, filter tuning and control signals being generated by the instrument processor 20 adn coupled to the DAC 591 on bus 592. The other I/O controls all other features. This split allows independent, high-speed control of the filters 33 during wide-band spectrum analyzer sweeps.

Four DACs are required to tune the 350 and 650 MHz filters 339 plus adjust the variable attenuator 35. The quad-DAC 591 contains two 8-bit registers for each DAC. Filter control during wide-band sweep is accomplished by processor-generated contgrol signals on bus 592 which transfer the contents of the first quad registers into the second registers simultaneously. For a 100 millisecond (ms) sweep, using 500 pixels, 200 microseconds (us) per tune frequency becomes the available time for serial control of the four DACs. At a serial data rate of b 500 kbits/sec (2 us per bit), 4 bytes plus overhead is about 50 bits requiring about 100 us. Since the instrument spectrum analyzer 16 log amplifier data must be acquired during a majority of each pixel period, for averaging, the filter tune data is loaded ahead of time. The first DAC register is loaded during one pixel period for use during the following pixel period. The transfer control signal on bus 592 transfers the data to the second register just prior to the start of the pixel period in which the log amplifier data will be taken for that filter setting. Since all four DAC bytes are transferred simultaneously, all filter tune signals adjust uniformly in time.

The DACs provide a 0 to +5 volt swing which must be translated to a 0 to +25 volt swing to maximize the filter varactor-tuned range. Each varactor drive circuit 593 comprises an operational amplifier (OP-amp) coupled to a zener diode which provides a voltage step translation to allow a +/−5 volt OP-amp output swing to control a drive transistor's base voltage at +27 volts. The amplifier circuit 593 output voltage is divided by 5 and used as feedback to the OP-amp thus giving the amplifier circuit 593 a DC gain of 5. However, since the zener diode is noisy and can thus modulate the varactor diode and create sideband noise on a signal in the filter frequency range, the zener diode noise is RC filtered with a 3dB corner at about 3 kHz.

The variable attenuator 35 compensates-for overall frequency response of the instrument input section 10. For each configuration of RF switches, filters, amplifiers and other components the attenuator 35 is automatically adjusted by the instrument controller 20 to provide a uniform gain over the instrument frequency range. The variable attenuator 35 essentially comprises a pi attenuator utilizing PIN diodes for both series and shunt elements. The shunt diode current is set to produce the best match at about 10 dB of attenuation. The attenuator ranges from 2 to about 15 dB of loss with a varying impedance match, but provides better than 15 dB return loss.

As frequencies approach 1 GHz, the attenuator series PIN diode junction capacitance begins to predominate and thus limit the dynamic attenuation range. By adding a post shunt PIN diode (not shown) and driving its DC bias from the filter tune line 20 via driver 595, as the series PIN diode is turned off due to an increasing control voltage to the attenuator, the shunt PIN diode turns on thus improving the dynamic range at 1 GHz.

A 12 dB gain broad band buffer amplifier 61 offsets the filter 33 RF signal path loss and effectively isolates the variable attenuator 35 from the instrument mixer module 12 input. A peak detector 63 meansures peak signal power at the receiver port 34 and functions as an instrument-internal diagnostic tool.

A pre-scaler circuit 38 coupled to the receiver path vai PIN splitter/switch 29 continuously samples the RF signal on the receiver path. The pre-scaler circuit 38 provides 1) a signal of less than 5 MHz which is related to the user input signal frequency to the instrument counter 13 auto-tuning of the instrument and b 2) provides a sensitive level detection for A) auto-ranging the receiver path input step attenuator, and B) determining when to auto-zero the RF peak detector 49.

The pre-scaler 38 must handle signal levels up to the antenna port 21 overpower threshold (about +26 dBm) and provide auto-tuning to +20 dBm. A PIN diode limiter 381 provides some protection for levels greater than −/+10 dBm. At 50 MHz, the limiter 381 has a 1 dB compression point of +11 dBm. At +30 dBm drive, it limits the output to +16 dBm.

Surface-mount series resistors raise the input impedance and shunt resistors counteract some of the added parasitic capacitance from the PIN diode junction. The input match of the limiter 381, with a 50 ohm load, is better than 10 dB return loss at 1 GHz. The insertion loss range from about 2.5 dB at 50 MHZ to about 3.5 dB at 1 GHz.

Amplifier 383, without external feedback, are cascaded to produce about 45 dB of gain. Table II shows a rough calculation of the required gain for the test instrument of the preferred embodiment.

TABLE II

| REQUIRED GAIN | |
|---|---|
| Sensitivity spec | −32 dBm (at antenna) |
| Bench test margin (10 dB) | −42 dBm |

TABLE II-continued

| REQUIRED GAIN | |
|---|---|
| Receiver switch loss (3 dB) | −45 dBm |
| Limiter loss (3 dB) | −48 dBm |
| Variable atten loss (2*2.5 dB) | −53 dBm |
| Gain amps (3*15 dB) | −8 dBm (at ECL divider) |
| ECL divider sensitivity | −15 dBm |

Two variable attenuators 385 provide about 15 to 20 dB of attenuation having their best impedance match at around 10 dB of attenuation. The attenuator driver 387 is part of an AGC feedback loop which is capable of about 15 mA of PIN diode current for the pre-scaler's most sensitive mode.

An ECL frequency divider 389 input is limited to 200 mVp-p, which corresponds to about 75 mV from the post-amplifier peak detector 391. The detector 391 is similar to the RF peak detector 491 described above. The detector output is compared against a 75 mV reference and the resulting error signal drives both variable attenuators 385. The total PIN diode drive current is monitored and amplified for use by the instrument voltmeter 11. Similarly the detector 391 voltage is also routed to the voltmeter 11 via amplifier 393.

The AGC loop is low pass filtered at about 200 Hz and the AGC and detector voltages are cut off below 10 Hz. Since none of these measurements are required to be fast, the system voltmeter 11 measurements are only every 200 mS (5Hz), the primary concern is simply dampening all low-rate AM effects on the input RF signal. These effects include 200 Hz AM, transmitter key/un-key cycles, and antenna coupling variations, such as encountered with hand-held radios.

The range of the detector 391 sensitivity, at 100 MHz, with the receiver path switch 29 off is −70 to −41 dBm. With the receiver path switch 29 on, the range becomes −60 to −25 dBm. The AGC active range at 100 MHz is −42 dBm and above with the receiver path switch 29 off and −27 dBm and above with the receiver path switch 29 on. The AGC loop action is that of an active limiter. The Attenuator PIN diodes are kept at maximum current until the antenna port input signal reaches about −36 dBm thus producing about 200 mV at the ECL divider 389 input.

The frequency divider 389 comprises a low-power ECL divider, such as an MC12074, with pre-amp and operates over the range of 50 to 1000 MHz. Like any ECL divider, it will "free-run" at about 500 to 800 MHz with no signal applied. Typically, this oscillation can be minimized by shifting the input stage bias with a 10 k resistor, but at a substantial reduction in sensitivity. Therefore, DC power to the ECL divider is turned off during the interval between measurements. The ECL divider sensitivity curve is flat from 150 to 900 MHz at about 10 mV (−27 dBm), but rises sharply by about 5 dB at the limits of 50 and 1100 MHz increasing the necessity for RF amplifier stages.

Following the divider circuit 389 is an ECL to TTL translator to provide TTL level signals to switch 394. The base bias voltage was selected for uniform ECL output level triggering from the ECL 0.8 Vp-p output.

The maximum level from the pre-scaler RF gain stages is set by the AGC loop at 200 mV to prevent overdriving the ECL divider 389. On the other hand, the TTL divider 395 requires at least 2 Vp-p signal with very fast rise times to cleanly trigger at frequencies in excess of 50 MHz. To provide sufficient gain, a 15 dB gain buffer is followed by a 20+dB gain differential-pair amplifier 397 which generates 0–5 volt square waves. Both stages have processor controlled supply lines so that both the ECL and TTL divider signal paths can be turned off. The divide-by-16 TTL divider 395 includes an initial divide-by-8 stage utilizing AS logic because of its ability to trigger at frequencies greater than 80 MHz.

The final divider outputs from switch 394 are TTL level signals requiring further processing in order to drive the lowpass filtered control connector (not shown) utilized to couple the frequency signal from the RF signal interface 10. Amplifier 399 comprises a push-pull driver amplifier having a low output impedance (approximately 10 ohms in the preferred embodiment) to provide the appropriate TTL signal level.

Both the antenna and duplex port detectors 28, 32 are buffered schottky diode circuits designed for use exclusively in their linear region. Since the schottley diode impedance is predominantly reactive, the detector 28, 32 is isolated from its respective port with a 464/51.1 ohm voltage divider to maintain the load on the 50 ohm port line at 500 ohms and provide a 50 ohm source load impedance for the detector to compensate for the wide range in diode junction resistance as increasing RF power is applied to the diode.

If the user input signal exceeds a preset over-power threshold (approximately 300 mV in the preferred embodiment) an over power TTL latch is tripped forcing an associated port relay to a safe condition. For both ports 21, 25, the safest condition is achieved when coupled to the RF port power splitter 47 via switches 27, 57 and 51, respectively. A serial I/O interrupt line changes state to notify the processor. The processor 20 can reset the TTL latch at any time, but if the high voltage condition still exists, the latch will remain tripped by the hardware, and relay control will continue to select the safe state.

Since the duplex port relay can open circuit the duplex port 25, the impedance change will result in approximately double the port detector voltage. Therefore, the duplex port latch control line drives a transistor switch to increase the detector comparator threshold voltage raising if from 400 mV to 758 mV preventing the comparator from misreading the signal level.

An internal, independent, synthesized, signal generator 24 can be routed to either the duplex port 25, the RF I/O port 23, or the receiver port 34 (for service or calibration use). A 0 to 140 dB step attenuator 53 buffers the Sig-Gen port 52 from the duplex port 25 and is switched in 10 dB steps. Maintaining low cost within the allocated board space dictated the use of relays, chip resistors on glass epoxy (FR-4) board material and two 25 dB pads to provide 8 to 10 dB of margin below the relay isolation at 1 GHz.

In the preferred embodiment, the frequency dependent path loss in the step attenuator 53 is predominately linear reaching about 5 dB at 1 GHz. About 1.5 dB of this loss is associated with relays and the remaining 3.5 dB is stripline loss on the FR-4 board material.

The attenuator 53 housing casting and RF gasket effectively isolate each switched attenuator pad but other leakage paths, such as relay control lines, also exist. Relay coils are grounded at one end and bypassed with 0.1 uF capacitors at the other end. Since each relay control trace is long and must parallel the other relay control lines, series inductors and additional shunt capacitors are utilized to reduce the RF coupling. To compensate for high signal levels at the first two attenuator pads, filtered feed-throughs are utilized and the control traces for the associated relays are routed on a separate PC layer, isolated by a ground-plane and rows of "picket-fence" vias to create an isolation channel. Currents induced into the relay housings by the relay coils are grounded to the attenuator housing by a spring contact hat.

The duplex Gen signal can be routed either to the duplex port 25 or the RF I/O port 23 by means of the duplex switch 51. The duplex switch 51 terminates the RE I/O port power splitter 47 with a 50 ohm load whenever the duplex port 23 is selected.

Due to the diversity and physical distribution of input section 10 power requirements, separate medium power regulators are utilized providing greater isolation between sub-modules within the Input Section while allowing more individual tailoring to circuit needs.

In the preferred embodiment, all voltage regulators are based on the TL431 voltage reference which acts like a variable zener diode. Bypass capacitors are utilized to stabilize the internal amplifier and suppress internal noise. Positive and negative 10 volt regulators are provided for exclusive use of the RF peak detector 49 to provide an additional 1 volt swing for the detector amplifiers and provide maximum isolation from noise and load variations.

The present invention has been particularly described with reference to a preferred embodiment thereof. However, it should be understood that the foregoing detailed description is only illustrative of the invention and those skilled in the art will recognize that changes in form and detail may be made without departing from the spirit of the invention or exceeding the scope of the appended claims.

I claim:

1. In a multi-function test apparatus which includes multi-instrumentalities controlled by processor control means, said processor control means enabled by a stored program and user inputs to configure said multi-instrumentalities controlled to perform a plurality of desired functions, a radio frequency (RF) signal interface coupling user equipment under test to said multi-function test apparatus, said RF signal interface comprising:
  a low power RF signal input for receiving a low power RF signal input from equipment under test;
  a high power RF signal input port for receiving a high power RF signal input from equipment under test;
  first switch means coupled to said low power RF signal port and to said high power RF signal port, said first switch means for selectively coupling a selected one of said low power and high power RF signal ports to a first interface port, said first interface port for coupling an RF signal to selected ones of a plurality of instrumentalities within said test apparatus; and
  an RF signal output port coupled to a second interface port, said RF signal output port for coupling an RF signal to equipment under test, said RF signal internally generated by at least one of said pluralities of instrumentalities within said test apparatus, said second interface port for coupling said RF signal to said RF signal output port.

2. An RF signal interface as in claim 1 further comprising first attenuator means coupled between said first switch means and said first interface port, said first attenuator means for selectively attenuating an RF signal.

3. An RF signal interface as in claim 2 further comprising:
  second attenuator means coupled between said high power RF signal input port and first switch means, said second attenuator means for attenuating a high power level RF signal applied to said high power RF signal input port; and
  second switch means coupled to said RF signal output port, said second attenuator means and said second interface port for selectively coupling an internally generated RF signal from said second interface port to said RF signal output port or to said second attenuator means.

4. An RF signal interface as in claim 3 further comprising third attenuator means coupled between said second interface port and said second switch means for selectively attenuating an internally generated RF signal.

5. An RF signal interface as in claim 1 further comprising first and second power level detection means coupled to said low power RF signal input port and to said RF signal output port, respectively, said first and second power level detection means for measuring the power level of an RF signal present at said low power RF signal input port and said RF signal output port, respectively.

6. An RF signal interface as in claim 5 whererin each said power level detection means includes relay means, said relay means auttomatically switching said low power RF signal input port and said RF signal output port, respectively, to a safe condition if the measured power level of an RF signal exceeds a predetermined value.

7. An RF signal interface as in claim 1 further comprising:
  power splitter means coupled between said high power RF signal input port and said first switch means, said power splitter means for coupling a portion of an RF signal applied to said high power RF signal input port to said first switch means; and
  power measurement means coupled to said power splitter means, said power splitter means coupling a portion of said RF signal to said power measurement means, said power measurement means for providing a continuous power measurement of a device under test coupled to said high power RF signal input port.

8. An RF signal interface as claim 1 further comprising:
  a power splitter coupled between said first switch and said first interface port for coupling a portion of said RF signal to said first interface port; and
  prescaler means coupled to said power splitter, said power splitter coupling a portion of said RF signal to said prescaler means, said prescaler means for providing continuous monitoring of said RF signal and generating a frequency signal representative of the frequency of said RF signal and a voltage level signal representative of the voltage level of said RF signal.

9. An RF signal interface as in claim 8 wherein said power splitter includes switch means having a first mode coupling a major portion of said RF signal to said first interface port and a second mode coupling said RF signal to said prescaler means.

10. An RF signal interface as in claim 8 further comprising prefilter means coupled between said power splitter and said first interface port, said prefilter means providing selective filtering of said RF signal.

11. An RF signal interface as in claim 10 wherein said prefilter means comprises a plurality of selectable bandpass filters, each of said selectable bandpass filters filtering RF signals in a different predetermined portion of a desired frequency range for said multi-function test apparatus.

12. An RF signal interface as in claim 11 wherein said plurality of selectable bandpass filters comprise at least two tuned fixed-element bandpass filters and at least two varactor-tuned, field-coupled bandpass filters, said varactor-tuned filters responsive to a tuning control signal for tuning said varactor-tuned filters to a desired frequency.

13. A RF signal interface as in claim 12 further comprising;

digital-to-analog convertor means coupled to said multi-function test apparatus processor for receiving a processor-generated digital tune signal and providing said tuning control signal in analog form; and amplifier means coupled to said prefilter means and to said digital-to-analog converter means for amplifying said tuning control signal.

14. An RF signal interface as in claim 13 wherein said processor responsive to said frequency signal generates a digital tune signal for continuously filter tuning across a desired frequency range.

15. An RF signal interface as in claim 10 further comprising a variable attenuator means coupled between said prefilter means and said first interface port, said variable attenuator means responsive to a control signal for providing uniform attenuation of said RF signal over a desired frequency range.

16. An RF signal interface as in claim 15 wherein said control signal is generated by said multi-function test apparatus processor responsive to said frequency signal.

* * * * *

UNITED STATES PATENT AND TRADEMARK OFFICE
CERTIFICATE OF CORRECTION

PATENT NO. : 5,059,892

DATED : October 22, 1991

INVENTOR(S) : David E. Stoft

It is certified that error appears in the above-identified patent and that said Letters Patent is hereby corrected as shown below:

Col. 1, l. 52 - delete "use's" and insert therefor --user's--;

Col. 4, l. 23 - delete "23 dB" and insert therefor --20 dB--;

Col. 5, l. 65 - delete "thrown" and insert therefor --throw--;

Col. 5, l. 67 - delete "white" and insert therefor --while--;

Col. 8, lines 41-53 - delete Table I, and insert therefor the following replacement Table I: Filter Selection vs Tune Frequency

| BAND | FILTER | L.O. | IMAGE |
|---|---|---|---|
| 400 kHz | 150 MHz LP | 614.4-764 MHz | 1228.4-1378.0 |
| 150 MHz | | Fin + 614 | Fin + 1228 MHz |
| 150 MHz | 150-386 MHz BP | 764-1000 MHz | 1378-1614 MHz |
| 386 MHz | | Fin + 614 MHz | Fin + 1228 MHz |
| 386 MHz | 350-650 MHz TBPF | 500-764 MHz | 614-878 MHz |
| 650 MHz | | Fin + 114 MHz | Fin + 228 MHz |
| 650 MHz | 650-1000 MHz TBPF | 764-914 MHz | 878-1028 MHz |
| 800 MHz | | Fin + 114 MHz | Fin + 228 MHz |
| 800 MHz | 650-1000 MHz TBPF | 536-886 MHz | 572-772 MHz |
| 1000 MHz | | Fin - 114 MHz | Fin - 228 MHz |

UNITED STATES PATENT AND TRADEMARK OFFICE
CERTIFICATE OF CORRECTION

PATENT NO. : 5,059,892

DATED : October 22, 1991

INVENTOR(S) : David E. Stoft

It is certified that error appears in the above-identified patent and that said Letters Patent is hereby corrected as shown below:

Col. 9, l. 46 - delete "contgrol" and insert therefor --control--;

Col. 10, l. 34 - delete "meansures" and insert therefor --measures--;

Col. 10, l. 42 - delete "b"; and

Col. 13, l. 12 - delete "RE" and insert therefor --RF--.

In the Claims:

Col. 14, l. 6 - between "and" and "first" insert therefor --said--;

Col. 14, l. 29 - delete "whererin" and insert therefor --wherein--; and

Col. 14, l. 31 - delete "auttomatically" and insert therefor --automatically--.

Signed and Sealed this

Twenty-fifth Day of April, 1995

Attest:

BRUCE LEHMAN

Attesting Officer

Commissioner of Patents and Trademarks